US006734108B1

(12) United States Patent
Jin et al.

(10) Patent No.: US 6,734,108 B1
(45) Date of Patent: May 11, 2004

(54) SEMICONDUCTOR STRUCTURE AND METHOD OF MAKING CONTACTS IN A SEMICONDUCTOR STRUCTURE

(75) Inventors: Bo Jin, Campbell, CA (US); Jianmin Qiao, Fremont, CA (US); Shahin Sharifzadeh, Menlo Park, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 09/405,945

(22) Filed: Sep. 27, 1999

(51) Int. Cl.⁷ ............... H01L 21/302; H01L 21/3065
(52) U.S. Cl. ............ 438/700; 438/706; 438/712
(58) Field of Search ................ 438/700, 706, 438/712

(56) References Cited

U.S. PATENT DOCUMENTS

| 5,037,781 | A | * | 8/1991 | Woodruff et al. | ........... 438/400 |
|---|---|---|---|---|---|
| 5,376,562 | A | * | 12/1994 | Fitch et al. | ........... 438/155 |
| 5,378,654 | A | * | 1/1995 | Hsue | ........... 438/305 |
| 5,468,342 | A | * | 11/1995 | Nulty et al. | ........... 438/714 |
| 5,503,901 | A | * | 4/1996 | Sakai et al. | ........... 438/723 |
| 5,661,064 | A | * | 8/1997 | Figura et al. | ........... 438/396 |
| 5,728,595 | A | * | 3/1998 | Fukase | ........... 438/241 |
| 5,776,834 | A | * | 7/1998 | Avanzino et al. | ........... 438/692 |
| 5,893,740 | A | * | 4/1999 | Chang et al. | ........... 438/289 |
| 5,907,771 | A | * | 5/1999 | Ploessl et al. | ........... 438/243 |

FOREIGN PATENT DOCUMENTS

| JP | 10-223897 | * | 8/1998 | ........... H01L/29/78 |
|---|---|---|---|---|
| TW | 304278 A | * | 5/1997 | ........... H01L/21/28 |

OTHER PUBLICATIONS

Atsushi Semiconductor Device and Its Manufacture, Aug. 21, 1998, Japan Patent Office, (English transalation of Abstract and Claims of JP 10223897), 3 pages.*
Nippon Steel Corp, Wiring pattern formation method for DRAM—involves forming two holes and groove on wiring layer which is patterned for electric conduction. Aug. 21, 1998, Derwent Information LTD.,(English Abstract of JP 10223897), 2 pages.*
Jang et al., Source–drain distributed implantation method—forming gate structure and two source/drains by implanting second dopant and third area by implanting first LATI, English Abstract of TW 304278A, pp. 1 and 2, May 1997.*

* cited by examiner

Primary Examiner—Nadine G. Norton
Assistant Examiner—Lynette T. Umez-Eronini
(74) Attorney, Agent, or Firm—Bradley T. Sako (57) ABSTRACT

According to one embodiment (300), a method of forming a self-aligned contact can include forming adjacent conducting structures with sidewalls (302). A first insulating layer may then be formed without first forming a liner (304), such as a liner that is conventionally formed to protect underlying conducting structures and/or a substrate. A contact hole may then be etched between adjacent conducting structures (306). Contact structures may then be formed (308).

11 Claims, 10 Drawing Sheets

SEMICONDUCTOR STRUCTURE AND METHOD OF MAKING CONTACTS IN A SEMICONDUCTOR STRUCTURE

TECHNICAL FIELD

The present invention relates generally to the fabrication of integrated circuits, and more particularly to the formation of contacts in an integrated circuit.

BACKGROUND OF THE INVENTION

Most integrated circuit (IC) manufacturing processes typically include a number of manufacturing steps. Such steps may form, shape or otherwise modify a material, such as a conductive, semiconductive and/or insulating material, and thereby create an IC device.

It can be desirable to reduce the number of steps in a manufacturing process. Such a reduction in process steps may have a number of beneficial results. The complexity of the overall manufacturing process may be reduced, making the fabrication of an IC easier to accomplish. A process yield may be increased, as the elimination of one or more steps may translate into fewer chances of forming defects. An IC may be fabricated in a shorter time period (cycle time is reduced). This can reduce the overall cost and/or increase manufacturing capacity.

The elimination of particular IC manufacturing process steps may have other benefits. For some integrated circuits, it may be desirable to minimize an IC's exposure to temperature cycles (keeping as small a "thermal budget" as possible). Too many temperature cycles in a fabrication process may undesirably alter properties of structures formed within an IC. As just a few examples, if an IC includes metal-oxide-semiconductor (MOS) field effect transistors (FET), exceeding a thermal budget may result in shifts in the threshold voltage (Vt) of such transistors. The reliability of such transistors may also be adversely affected, as transistor junctions may be more susceptible to failure mechanisms such as junction breakdown or "punch-through" current.

If an integrated circuit includes metal contacts to a doped semiconductor substrate, temperature cycles may result in higher contact resistance due to segregation of dopants at the metal-semiconductor interface and/or increased oxidation of the metal.

If an integrated circuit includes a substrate with diffusion regions formed with dopants, temperature cycles may increase diffusion region features due to out-diffusion of dopants.

Accordingly, reductions in the number of temperature cycles in an IC manufacturing process may produce more robust devices, avoid higher contact resistance, and/or allow for smaller device features.

Integrated circuits can typically include various layers of conductive and/or semiconductive materials (referred to herein collectively as "conducting" materials), as well as insulating materials. For example, an integrated circuit may include a substrate in which a number of active devices (such as transistors) may be formed. Such active devices may then be connected to one another by one or more conducting layers. The interconnecting conducting layers may be separated from one another by insulating layers.

A conducting layer may be formed from a single layer of material, or alternatively, include one or more conducting materials. As just a few examples, such a layer can include a conventionally doped polycrystalline silicon (polysilicon) and "silicide" (silicon-metal alloy). Alternatively, a conducting layer may include a titanium(Ti)-tungsten(W) alloy layered onto bulk aluminum, with an underlying barrier layer comprising Ti, Ti-nitride (TiN), or a Ti alloy.

Similarly, insulating layers can also be composites. As just one example, an insulating layer may include a "doped" silicon dioxide ("oxide") and an "undoped" silicon oxide (undoped silicate glass or "USG"). The doped silicon oxide can include dopant elements, such as boron and phosphorous, while the undoped silicon oxide can be essentially free of dopant elements. Phosphorous doped silicon dioxide (phosphosilicate glass or "PSG") can provide advantageous ion gettering and/or step coverage properties. Boron and phosphorous doped silicon dioxide (borophosphosilicate glass or "BPSG") can also provide such advantages, and can be formed at lower temperatures, and thus can result in a more desirable thermal budget.

An insulating layer may perform a variety of functions in an integrated circuit. For example, an insulating layer may serve to electrically isolate one conducting layer or structure from another. Further, an insulating layer may serve as the surface on which subsequent layers are formed and patterned. Therefore, in many cases it may be desirable for an insulating layer to provide a relatively planar surface.

Different conducting layers may be connected to one another and/or to a substrate by contacts and/or vias. Contacts and/or vias can include contact holes that extend through one or more insulating layers. Conventionally, a contact may connect a conducting portion of a substrate to a conducting layer, while a via may connect two different conducting layers to one another.

A conventional way of forming a contact hole in one or more insulating layers may include lithography and etch steps. Lithography can be used to form an etch pattern over an insulating layer (that includes the location of contact holes). An etch step can transfer the pattern onto one or more lower situated insulating layers.

One concern with certain contact structures can be the alignment of a contact with a lower conducting layer. Because a contact is usually formed by etching a hole through an insulating layer to an underlying conducting layer or structure, it is desirable that an etched hole to be aligned over the desired contact location in the lower conducting layer.

Further, it may be desirable to ensure that a contact hole is sufficiently insulated from other conductive lines. For example, in the case of semiconductor devices having insulated gate field effect transistors (IGFETs), such as metal-oxide-semiconductor FETs (MOSFETs), it is desirable to have a contact hole aligned with a source or drain, but at the same time, be sufficiently insulated from a conducting gate structure. A common approach to aligning contacts to conducting gate structures is a "self-aligned" contact. A self-aligned contact may include a lower conducting structure (such as a transistor gate) that includes a top insulating layer and a side insulating layer (such as a "sidewall"). With such an arrangement, a contact hole can be etched without a minimum spacing requirement with respect to the lower conducting structure.

Another concern regarding, contacts and/or vias is contact area. The area of a contact can be of concern as a substrate on which a contact is formed may also include other important features, such as transistor channels, transistor isolation structures, transistor diffusion regions, and/or device wells. Thus, reductions in contact size can provide more area for other features and/or reduce the overall size of an integrated circuit device. Further, in many processes, contact area may have a minimum requirement in order to ensure a low enough contact resistance value. Thus, it is desirable that a contact forming process be capable of meeting a minimum contact resistance value.

Various factors may contribute to reducing contact area. In the case of "self-aligned" contacts, sidewalls and/or other structures, such as "etch" stop layers, may encroach on a contact area. Another factor is that of contact aspect ratio (AR). An aspect ratio can describe the ratio between a contact height and width, when viewed in cross section. The higher the aspect ratio, the more difficult it may be to form the contact.

To better understand the formation of certain integrated circuit structures, including contacts structures, a conventional self-aligned contact (SAC) approach is set forth in FIGS. 7A–7H. FIGS. 7A–7H set forth a number of side cross-sectional views of a portion of an integrated circuit.

Figure 7A:
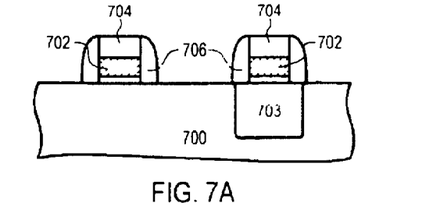
FIGS. 7A to 7H illustrate a conventional method of forming self-aligned contacts.

FIG. 7A shows a substrate 700 on which may be formed conducting structures 702. A conducting structure 702 may be the gate of an insulated gate field effect transistor, such as a MOSFET. A substrate 700 many include doped monocrystalline silicon having various diffusion regions (not shown) formed therein. Further, an isolation structure 703 may be formed in a substrate 700. A conducting structure 702 may include doped polycrystalline silicon, ("poly") having a layer of silicide formed thereon.

A conducting structure may further include a top insulating structure 704 and sidewalls 706. Sidewalls may be formed by the deposition of an insulating material and a subsequent anisotropic etch of the insulating material. As just one example, a top insulating structure 704 and sidewalls 706 may conventionally include silicon dioxide.

Figure 7B:
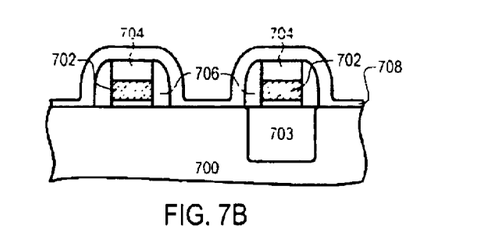

FIG. 7B shows an integrated circuit following the formation of a liner 708. A liner 708 may protect a substrate 700 and a conducting structure 702 from a subsequent etch, thereby serving as an etch stop layer for the subsequent etch. In particular, a liner may prevent substantial etching of a sidewall and/or an isolation structure within a substrate 700. Even more particularly, an isolation structure and a subsequently formed first insulating layer may both include silicon dioxide. Thus, an etch through a first insulating layer (such as a contact hole forming etch) may have no substantial selectivity with an isolation structure. Consequently, without a liner 708, such an etch may "gouge" an isolation structure. Such gouging can result in leakage current that may adversely affect integrated circuit reliability and/or the characteristics circuit devices (such as transistors).

A liner may include silicone nitride. A drawback to a silicon nitride liner can be the temperature at which such a layer may be formed, which may increase a thermal budget.

Figure 7C:
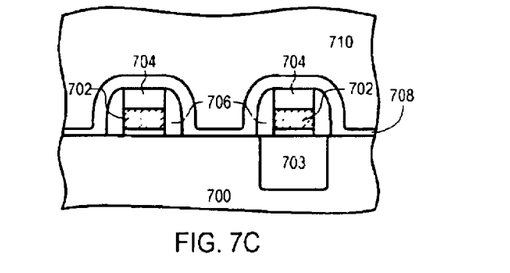

FIG. 7C shows an integrated circuit following the formation of a first insulating layer 710. A first insulating layer 710 can insulate a substrate 700 and/or a conducting structure 702 from a subsequently formed contact and/or interconnect pattern. A first insulating layer may include BPSG deposited by a plasma enhanced chemical vapor deposition (PECVD) step.

BPSG may be selected as a conventional choice for a first insulating material due to its low "reflow" temperature. Reflow involves heating a layer so that the layer becomes more malleable, and thus flows to fill in the lowest lying space. The reflowed layer may thus become more planar than the originally deposited layer. A reflow step may also add to the thermal budget of a manufacturing process.

Generally, the higher the concentration of boron and phosphorous, the lower the reflow temperature of the BPSG. BPSG is also desirable in that it can be a getterer for undesirable mobile ions, such as sodium, that can result in reliability failures in integrated circuits. Unfortunately, BPSG can have undesirable properties as well. The boron ions within BPSG can out-diffuse from the BPSG into the substrate, unintentionally doping the substrate. In addition, boron dopants can out-diffuse into polysilicon lines, unintentionally lowering or raising the conductivity of such lines.

While BPSG provides a relatively lows reflow temperature, there are limits to BPSG reflow temperatures. Such limits arise out of the adverse effects presented by highly doped BPSG. Relatively high concentrations of boron (e.g., over 5% by weight) may make the resulting BPSG film unstable and hygroscopic (attract moisture). Unstable BPSG can crack and/or form boron rich crystals. BPSG cracks can ruin the insulating properties of the BPSG, while boron rich crystals may result in non-planar surfaces and/or micro-masking etch defects. The hygroscopic nature of conventional high-concentration BPSG can create bubbles, or result in forming one or more phosphorous-based acids. Which may corrode conductive lines, such as those containing aluminum.

A BPSG layer may also be densified. A densification step may by incorporated into a reflow step or occur prior to, or after a reflow step. Densification can increase the stability of an insulating layer. Densification may be accomplished by raising the temperature of a BPSG layer following its deposition. Thus, densification of a BPSG may also contribute to the thermal budget of a process.

Another insulating material is phosphorous doped glass (phosphosilicate glass, or "PSG"). PSG is generally not used in conventional approaches due to its higher flow temperature. The flow temperature can be lowered by increasing the concentration of phosphorous, but higher concentrations of conventional PSG may have the drawbacks discussed above, including the formation of bubbles and/or acids. Accordingly, conventional PSG approaches may not be used as first insulating layer as such approaches can result in a higher thermal budget than those that include BPSG.

Figure 7D:
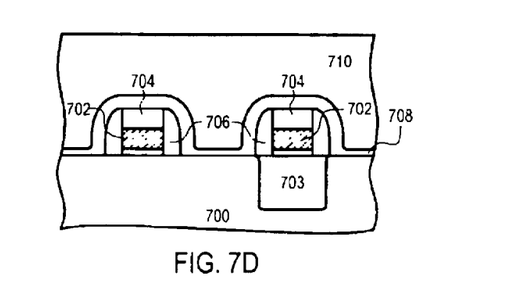

A first insulating layer 710 may also be planarized. An integrated circuit following a planarization step is shown in FIG. 7D. A planarization step may include chemical-mechanical polishing (CMP).

Figure 7E:
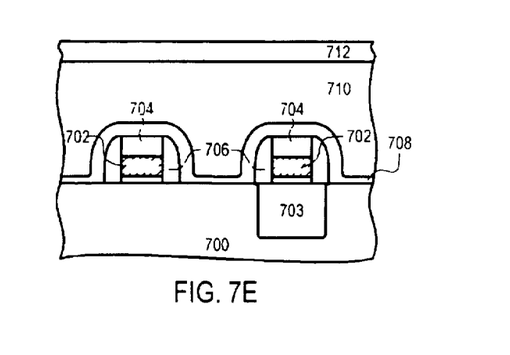

Following a planarization step a "cap" insulating layer 712 may be formed over a first insulating layer 710. A cap insulating layer 712 may serve to prevent the migration of dopants within a first insulating layer 710 and/or prevent moisture from migrating into a first insulating layer 710. A cap insulating layer 712 may also provide a more stable surface for subsequent layers. A conventional cap insulating layer 712 may include undoped silicon dioxide. An integrated circuit following the formation of a cap insulating layer is shown in FIG. 7E.

Figure 7F:
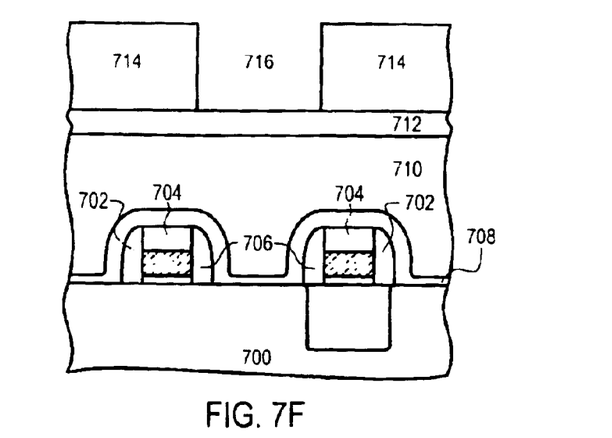

FIG. 7F shows an integrated circuit following the formation of a contact etch mask 714. A contact etch mask 714 may he formed with conventional photolithographic techniques, and include developed photoresist with mask openings 716 that can expose portions of a cap insulating layer 712.

Figure 7G:
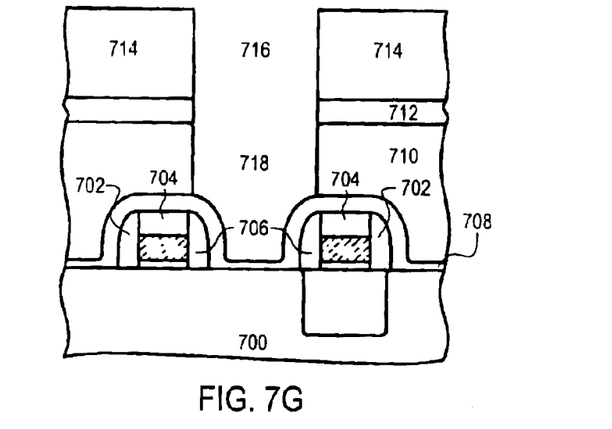

With a contact etch mask 714 formed over a cap insulating layer 712 and first insulating layer 710, a contact hole 718 may be etched to a substrate 700 that is self-aligned with respect to a conductive structure 702. In the event a cap insulating layer 712 and first insulating layer 710 are undoped silicon dioxide and BPSG, respectively, a formation of contact hole may include a two step etch process. A first etch may be optimized for removal of undoped silicon dioxide and a second etch may be optimized for the removal of BPSG. An integrated circuit following the formation of a contact hole is shown in FIG. 7G.

An etch that forms a contact hole 718 through a first insulating layer 710 and/or a cap insulating layer 712 may be selective between a liner 708 and a first insulating layer 710. As shown in FIG. 7G, following such an etch, a liner 708 may remain substantially intact, and protect a substrate 700, and/or a sidewall 706, and/or a top insulating structure 704 from such a contact etch. In the event a first insulating layer 710 includes BPSG and a liner 708 includes silicon nitride, such an etch may be all "oxide" etch. An oxide etch may etch a layer of silicon dioxide or doped silicon dioxide at a substantially faster rate than a layer of silicon nitride.

Figure 7H:
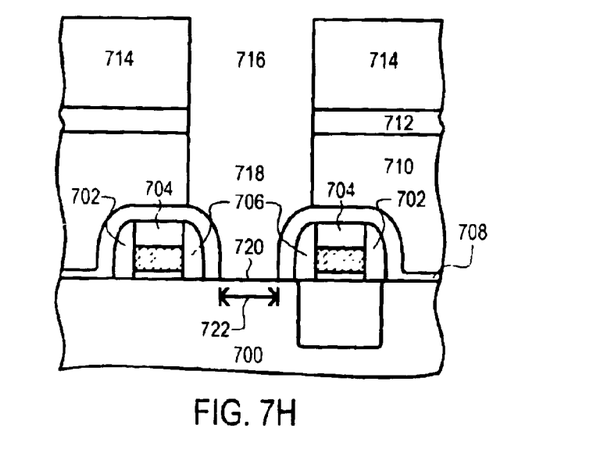

A liner etch may then remove portions of a liner 708. An integrated circuit following a liner etch is shown in FIG. 7H. A liner opening 720 may be formed, exposing a portion of a substrate 700 forming a contact area. However, a contact area width, shown by measuring bar 722, may be limited by residual portions of a liner 708.

As feature sizes in ICs continue to shrink, conventional approaches to forming contacts may only provide limited results. It would be desirable to arrive at some way of increasing contact area over conventional approaches, such as that shown in FIGS. 7A to 7H.

It would also be desirable to reduce the thermal budget of an IC manufacturing process. Such a reduction may result in more reliable devices and smaller IC features.

It would also be desirable to reduce the number of steps in an IC manufacturing process. Such a reduction may result in faster cycle times, provide a simpler process and accrue the various other benefits thereof.

SUMMARY OF THE INVENTION

The various disclosed embodiments set forth methods of forming self-aligned contacts. Such methods may form contacts with features that are less than 0.20 microns ($\mu$m) without forming a liner to protecting lower conducting structure, such as a substrate and/or a transistor gate.

According to one aspect of the embodiments, self-aligned contacts may be formed in a first insulating layer that is not densified.

According to another aspect of the embodiments, a first insulating layer may include phosphosilicate glass (PSG).

According to another aspect of the embodiments, contacts may be formed to a substrate through a first insulating layer that includes silicon dioxide. Such contacts are self-aligned with respect to a transistor gate having a silicon nitride sidewall formed thereon.

According to another aspect of the embodiments, contacts may be formed that are self-aligned with two conductive structures separated from one another by 0.30 $\mu$m or less. A contact feature may be greater than 0.05 $\mu$m.

An advantage of one or more of the disclosed embodiments is that a small geometry contact may be formed without a protective liner.

Another advantage of one or more of the disclosed embodiments is that a method of forming self-aligned contacts may have a smaller thermal budget and/or fewer steps than conventional methods by not including a liner formation step.

Another advantage of one or more of the disclosed embodiments is that a method of forming self-aligned contacts through a first insulating layer may have a smaller thermal budget and/or fewer steps than conventional methods by not including a densification step for a first insulating layer.

DETAILED DESCRIPTION OF THE EMBODIMENTS

Various embodiments of the present invention will now be described in conjunction with a number of charts and diagrams. The embodiments set forth approaches to forming a self-aligned contact in an integrated circuit. Such a contact may be formed with fewer temperature cycles than conventional approaches. Alternatively, or in addition, such a contact may be formed without a liner, and thus may provide greater contact area.

Figure 1:
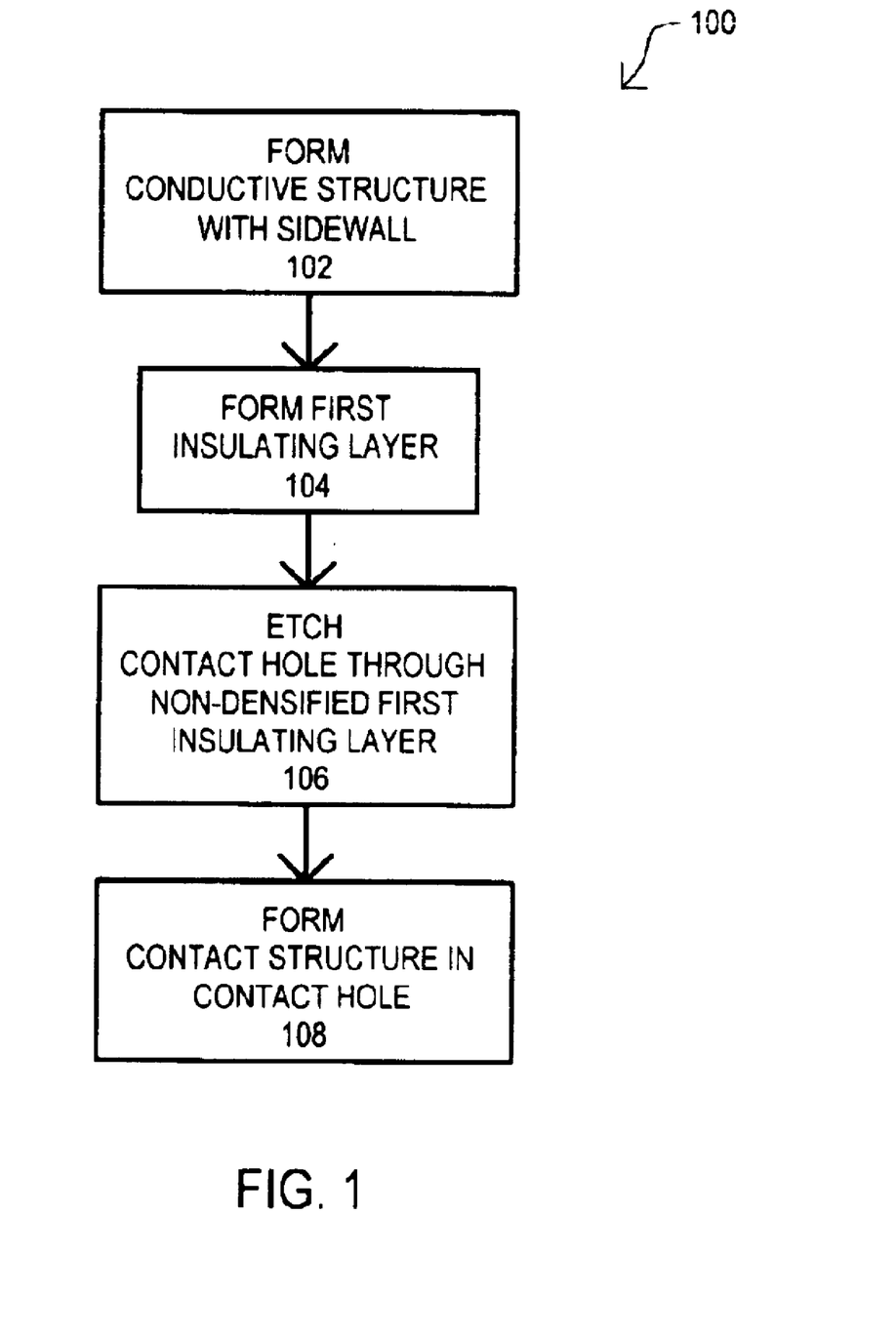
FIG. 1 is a flow diagram of a first embodiment.
Figure 2A:
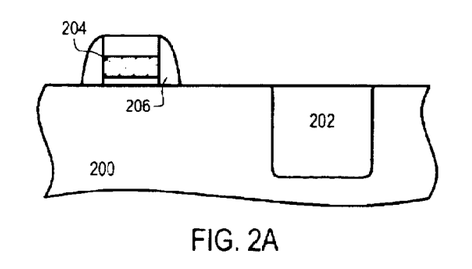
FIGS. 2A to 2D are side cross sectional views of a first embodiment.

Referring now to FIG. 1, a flow diagram is set forth illustrating method of forming self-aligned contacts according to a first embodiment. The first embodiment is designated by the general reference character 100, and may include forming a conducting structure with sidewalls (step 102). An integrated circuit following such a step is set forth in FIG. 2A. FIG. 2A includes a substrate 200 having an isolation structure 202. A substrate 200 may include a conductive or semiconductive material (referred to herein collectively as "conducting materials"), as just a few examples. An isolation structure 202 may be formed by a number of techniques, including shallow trench isolation (STI), recessed oxide isolation (ROI), or local oxidation of silicon (LOCOS), to name but a few examples.

As also shown in FIG. 2A, a conducting structure 204 may be formed on a substrate 200 that includes an insulating sidewall 206. An insulating sidewall (also referred to as a "spacer") may preferably comprise a material such as silicon dioxide ($SiO_2$), more preferably silicon oxynitride ($Si_XN_YO_Z$), and even more preferably silicon nitride ($Si_3N_4$).

Figure 2B:
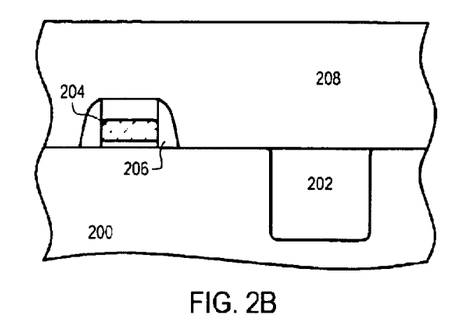

A first insulating layer may be formed (step 104) over a conducting structure and sidewall. An integrated circuit following a step 104 is shown in FIG. 2B. A first insulating layer 208 may provide a different etch response than a sidewall when exposed to a contact etch. As just one example, a first insulating layer may include silicon dioxide while a sidewall may include silicon oxynitride and or silicon nitride.

A first insulating layer 208 may be formed without first forming a protective liner. As will be discussed below, by not including a protective liner, a resulting contact may be larger than a conventionally formed contact.

A step 104 may particularly include depositing a layer of silicon dioxide that includes relatively high levels of phosphorous. Relatively high levels of phosphorous may include concentrations of phosphorous that exceed those used in other conventional insulating layers, such as borophosphosilicate glass (BPSG). For some approaches, relatively high levels of phosphorous may include levels that are greater than 50% by weight. More substantial departures from conventional approaches may include phosphorous concentrations that are greater than 7% by weight.

A first insulating layer may further be formed with high density plasma (HDP) deposition techniques. A high density plasma may include a charge density that, generally exceeds that used in conventional insulating layer deposition approaches (e.g., charge densities used in conventional plasma enhanced and plasma assisted chemical vapor deposition (PECVD and PACVD)). For example, a high density plasma may include a charge density that exceeds that used to deposit conventional PECVD BPSG layers. For some approaches, a high density plasma may include charge densities that generally exceed $10^7$ charged particles per $cm^3$, and more specifically, charge densities in the general range of $10^9$–$10^{12}$ charged particles per $cm^3$.

While a first insulating layer 208 may include other dopants, a first insulating layer 208 may be doped substantially only with phosphorous to form phosphosilicate glass ("PSG"). A first insulating layer 208 of PSG may not include any, or only insubstantial amounts of boron, and thus may be less susceptible to the adverse effects of boron.

It is understood that while the various embodiments refer to insulating and conducting layers as "first" such layers, such a term should not be construed as being limited to a first layer formed in a manufacturing process. Other layers may be formed below and/or prior to a "first" layer.

Figure 2C:
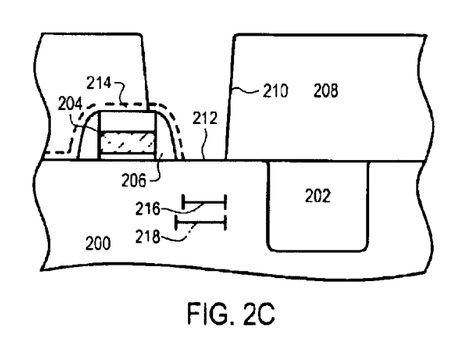

A first embodiment 100 may further include a step of forming a contact hole through a first insulating layer that is not densified (step 106). The first embodiment 100 may thus not include a step that densifies a first insulating layer. This can avoid a thermal cycle in a conventional process and thus may reduce the thermal budget of such a process. An example of an integrated circuit following a step 106 is shown in FIG. 2C, and includes a contact hole 210.

A step 106 may preferably include a substantially anisotropic reactive ion etch (RIE). A RIE etch may etch a first insulating layer 208 at a substantially faster rate than a sidewall 206. A portion of a substrate 200 may be exposed, forming a contact area 212.

A contact area 212 may have larger dimensions than a conventional method that includes a liner. A volume occupied by a residual liner is shown in FIG. 2C as a dashed line 214. A contact width formed by a conventional method is shown by measuring bar 216. A contact width formed by a first embodiment is shown by measuring bar 218. A measuring bar 218 may be larger than a measuring bar 216, as a residual liner 214 is not present to encroach into a contact area 212.

In addition or alternatively, a contact etch according to a step 106 may be selective between an isolation structure 202 and a first insulating layer 208. In this way, such a contact etch may remove a first insulating layer 208 but not remove substantial amounts of an isolation structure 202. Thus, a method according to a first embodiment may skip a liner formation step that may be conventionally used to preserve the integrity of an underlying isolation structure (such as 202).

Figure 2D:
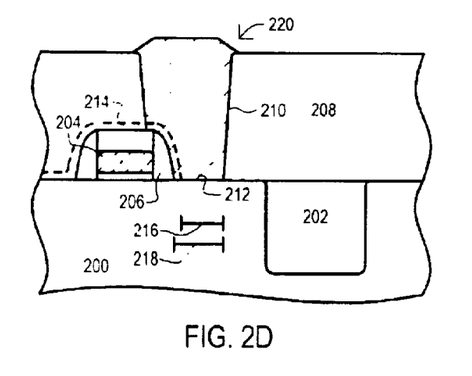

A first embodiment 100 may further include forming a contact structure in a contact hole (step 108). Such a step may include, as just one example, depositing one or more conductive materials into a contact hole. Conductive materials may be subsequently patterned and/or planarized to form a contact structure. An integrated circuit following a step 108 is shown in FIG. 2D. A contact structure 220 is shown formed within a contact hole 210.

In this way, a first embodiment 100 may form a contact through a first insulating layer that does undergo a densification and/or reflow step. This may eliminate a thermal cycle in a manufacturing process. In addition or alternatively, a liner formation step may be omitted. This may also eliminate a thermal cycle in a manufacturing process and/or result in larger contact area. In addition or alternatively, an etch that may form a contact hole through a first insulating layer may be selective between the first insulating layer and a lower isolation structure. A lower isolation structure may thus be preserved without forming a protective liner.

Figure 3:
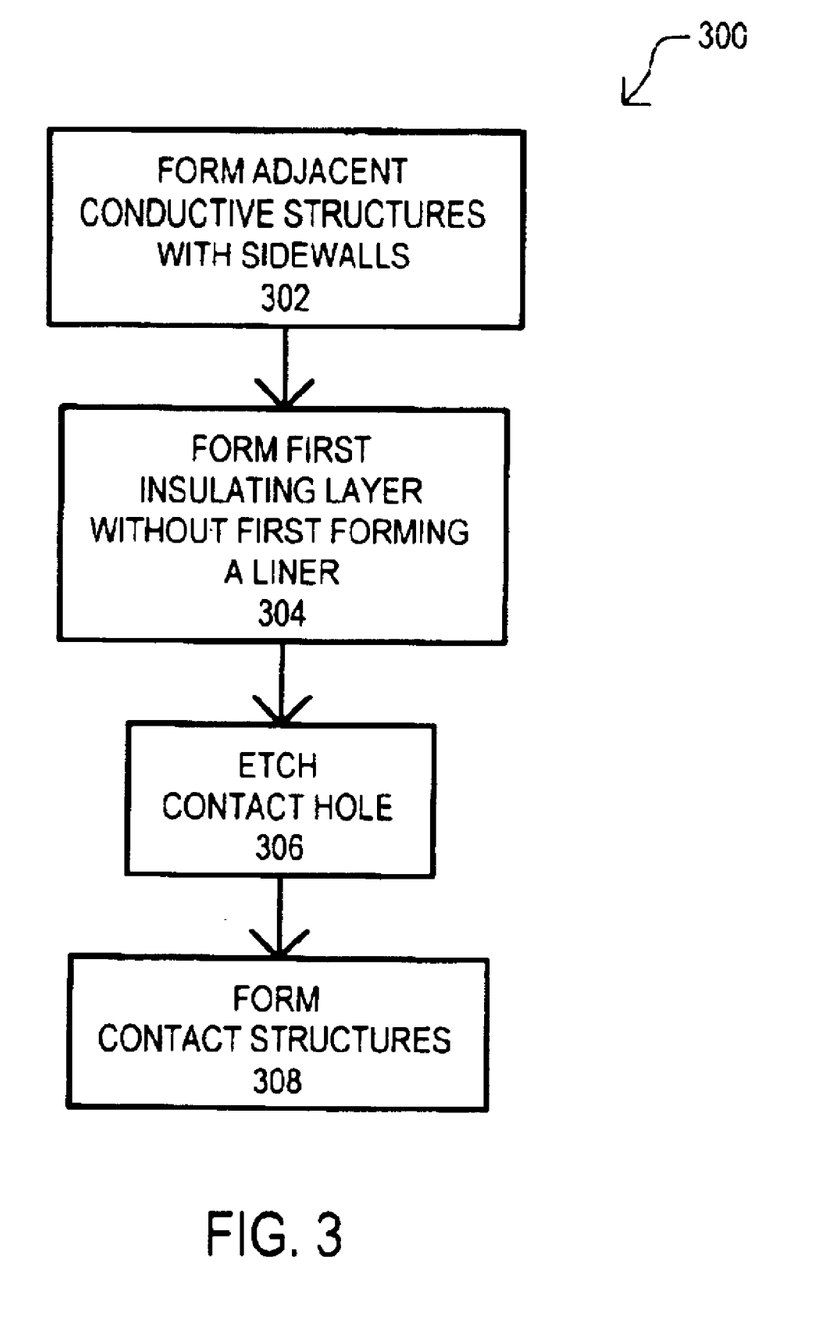
FIG. 3 is a flow diagram of a second embodiment.

A second embodiment is shown in flow diagram form in FIG. 3. A second embodiment is designated by the general reference character 300, and may include forming conductive structures adjacent to one another that include sidewalls (step 302). An integrated circuit following a step 302 is shown in FIG. 4A.

Figure 4A:
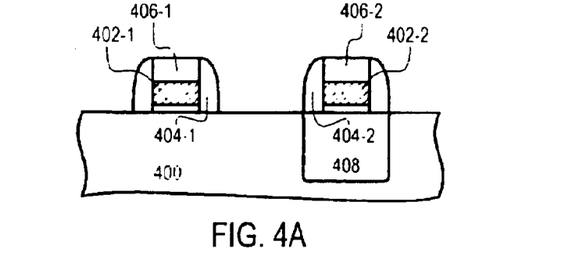
FIGS. 4A to 4D are side cross sectional views of a second embodiment

FIG. 4A includes a substrate 400 on which may be formed adjacent conducting structures 402-1 to 402-2. Conducting structures 402-1 to 402-2 may include insulating sidewalls 404-1 and 404-2 and top insulating structures 406-1 and 406-2. A substrate 400 may include an isolation structure 408.

Features and spacings of structures formed in a step 302 may have sizes that are conventionally formed with a protective liner. For example, sidewalls (404-1 and 404-2) and/or top insulating structures (406-1 and 406-2) can have a thickness that may not adequately protect a conducting structure (402-1 and 402-2) in a conventional self-aligned contact process. As one particular example, a lateral space between conducting structures (402-1 and 402-2) may be 0.4 microns ($\mu$m) or less, preferably 0.35 $\mu$m or less, or more preferably 0.3 $\mu$m or less. A lateral base width of sidewalls (404-1 and 404-2) may be 0.15 $\mu$m or less, preferably 0.10 $\mu$m or less, or even more preferably 0.07 $\mu$m or less.

A substrate 400, conducting structures (402-1 and 402-2), sidewalls (404-1 and 404-2), and isolation structure 408 may include the same preferred formation methods and materials and/or be subject to the same variations discussed in conjunction with FIG. 2A. A top insulating structure (406-1 and 406-2) may preferably comprise a material such as silicon dioxide ($SiO_2$), more preferably silicon oxynitride ($Si_xN_yO_z$), and even more preferably silicon nitride ($Si_3N_4$).

The second embodiment 300 may further include forming a first insulating layer without first forming a liner (step 304). Thus, unlike a conventional approach that may deposit a liner to protect small sized features from a subsequent etch, a second embodiment 300 may not include such a step. By excluding such a step, a second embodiment 300 may eliminate a temperature cycle and thereby reduce the thermal budget of a manufacturing process. An elimination of a liner step may be particularly advantageous as many conventional approaches include silicon nitride liners, and the deposition of silicon nitride may include relatively high temperatures.

Figure 4B:
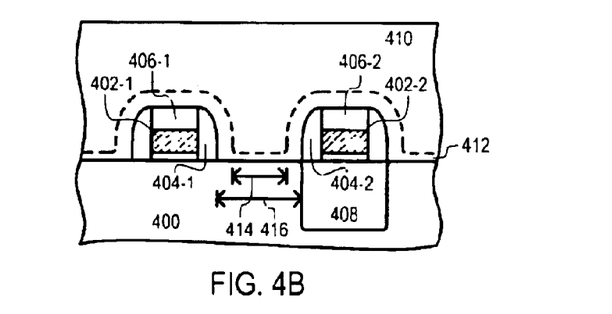

An integrated circuit following a step 304 is shown in FIG. 4B. A first insulating layer 410 may be formed over a substrate 400, including between adjacent sidewalls (404-1 and 404-2). A first insulating layer 410 may include the same preferred formation methods and materials and/or be subject to the same variations discussed in conjunction with first insulating layer 208 in FIG. 2B. A first insulating layer 410 may also preferably provide a different etch response than a sidewall and/or a top insulating structure when exposed to a contact etch.

It is understood that by not including a liner formation step, a space between adjacent sidewalls (404-1 and 404-2) may be larger than a conventional approach, as a liner is not present that encroaches into such a space. This is illustrated in FIG. 4B by a dashed line 412 that can represent a space that would be occupied by a liner. A conventional length measurement, that takes liner encroachment into account can be shown by measurement bar 414. A length measurement of a second embodiment can be shown by measurement bar 416. In the particular arrangement of FIG. 4B, a liner 412 may encroach from two sides.

Figure 4C:
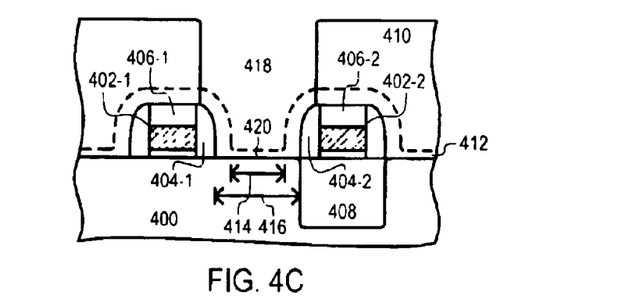

A second embodiment 300 may continue by etching a contact hole between adjacent conductive structures (step 306). An integrated circuit following a step 306 is shown in FIG. 4C. A contact hole 418 may be formed through a first insulating layer 410, exposing a portion of a substrate 400. An exposed portion of a substrate 400 may be a contact area 420. A contact hole 418 may be formed by the same preferred method and/or be subject to the same variations discussed in conjunction with FIG. 2C.

It is noted that because the second embodiment 300 does not include a liner forming step, a contact hole to a substrate may be formed without an additional liner opening step. This can lead to a process having fewer steps than a conventional approach.

It is also noted that because the second embodiment 300 does not include a liner forming step, a contact area 420 may be larger than a contact area formed with a conventional approach. In a conventional approach, a liner encroach into a contact area. Thus, measurement bar 414 represent a width measurement of a resulting contact area of a conventional approach. In contrast, in a second embodiment 300, there is no liner, thus a contact area 420 be larger than a conventional approach. Measurement bar 416 may represent a width measurement of contact area 420.

Figure 4D:
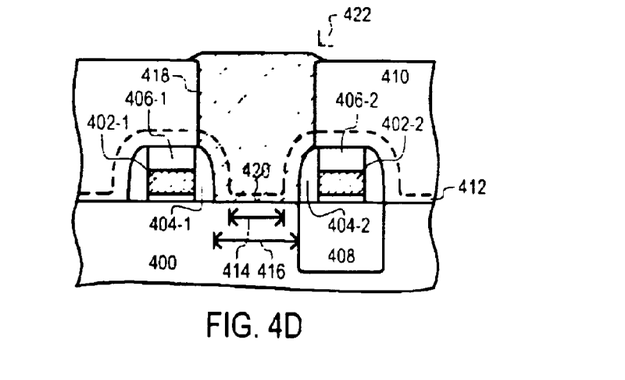

Once a contact hole 418 is formed, a contact structure may be formed. As shown in FIG. 4D, a contact structure 422 may be self-aligned with respect to adjacent conducting structures 402-1 and 402-2.

A contact structure be formed in the same fashion, include the same materials and/or be subject to the same variations discussed in conjunction with contact structure 220 of FIG. 2D. A contact structure is shown as item 422 in FIG. 4D.

In this way, a second embodiment 300 may form a contact through adjacent conducting structures without including a liner formation step. This may eliminate a thermal cycle in a manufacturing process and/or result in a larger contact area than a conventional approach.

Figure 5:
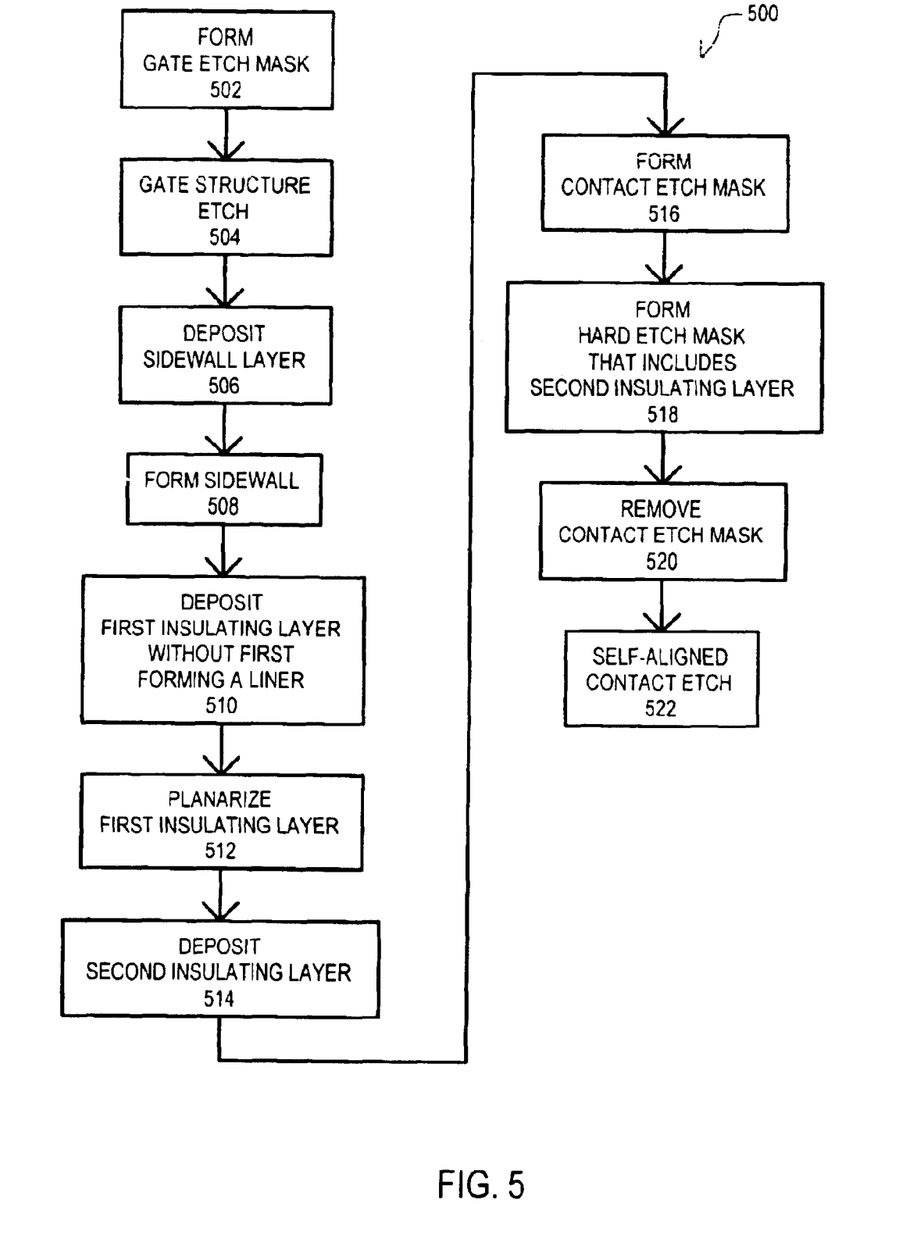
FIG. 5 is a flow diagram of a third embodiment.
Figure 6A:
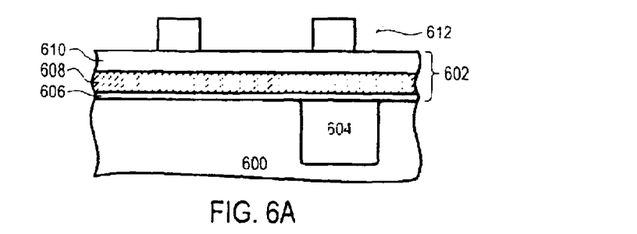
FIGS. 6A to 6K are side cross sectional views of a third embodiment.

Referring now to FIG. 5, a third embodiment is set forth in a flow diagram designated by the general reference character 500. A third embodiment 500 may include forming a gate etch mask (step 502). As shown in FIG. 6A, an integrated circuit may include a substrate 600 having a gate layer 602 formed thereon and an isolation structure 604 formed therein. A gate layer 602 may include a gate insulator layer 606, a gate conducting layer 608, and a gate top insulating layer 610.

In one particular arrangement, a gate insulator layer 606 may comprise silicon dioxide, and/or silicon nitride, and/or silicon oxynitride, to name just a few examples. A gate conducting layer 608 may include a conductive and/or semiconductive material. In a more particular example, gate conducting layer 608 may include doped polysilicon and a layer of silicide. A gate top insulating layer 610 may include silicon oxynitride, more preferably silicon nitride, to name just two examples. A gate top insulating layer 610 material may be selected to provide a different etch response than a subsequently formed first insulating layer.

FIG. 6A also includes a gate etch mask 612 formed over a gate layer 602. A gate etch mask 612 may include a gate pattern. A gate pattern may be formed by conventional photolithographic techniques. Gate mask portions may be situated over locations where a gate may be formed. Gate mask openings may be situated over locations where a gate layer 602 may be removed.

Figure 6B:
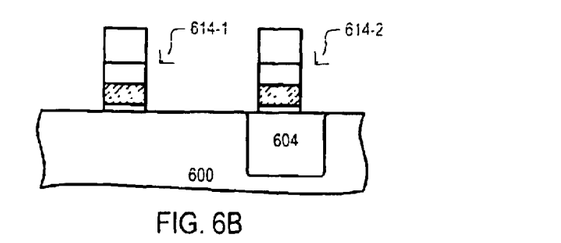

A third embodiment 500 may transfer a gate pattern from a gate etch mask to a gate layer with a gate structure etch (step 504). A gate structure etch may preferably include one or more a reactive ion etches (RIE), as just one example. An integrated circuit following a step 504 is shown in FIG. 6B. Portions of a gate layer that are exposed by a gate etch mask 612 can be removed, forming adjacent gate structures 614-1 and 614-2. A gate etch mask 612 may then be removed.

Figure 6C:
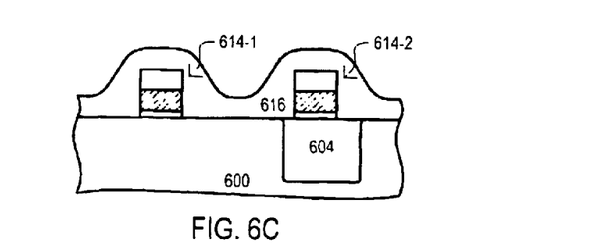

As shown in FIG. 5, a sidewall layer may be deposited (step 506). As shown in FIG. 6C, a sidewall layer 616 may be formed over gate structures (614-1 and 614-2). A sidewall layer 616 material, like a gate top insulating, layer 610 material, may be selected to provide a different etch response than it subsequently formed first insulating layer.

A sidewall insulating layer may preferably be formed by chemical vapor deposition (CVD) comprising a silicon source, such as silane, preferably a chlorosilane ($SiH_xCl_y$), more preferably dichlorosilane ($SiCl_2H_2$), and a nitrogen source, such as nitrogen ($N_2$), nitrous oxide ($N_2O$), preferably ammonia ($NH_3$). In one particular approach, silicon source flows into a deposition chamber may be in the general range of 5–100 standard $cm^3$ per minute (sccm), preferably 10–50 sccm, more preferably 25–35 sccm. Nitrogen source flows may be in the general range of 10–300 sccm, preferably 50–200 sccm, more preferably 80–110 sccm.

A sidewall insulating layer of CVD nitrogen may further be deposited at a temperature in the general range of 600–950° C., preferably 650–800° C., more preferably 725–775° C. Deposition chamber pressure may be in the general range of 5–500 milliTorr (mT), preferably 50–200 mT, more preferably 80–120 mT. Deposition time may be in the general range of 20–100 minutes (min), preferably 30–70 min, more preferably 40–60 min.

Of course, the various deposition parameters set forth should not be construed as limiting the invention thereto. As just a few examples, deposition times and/or temperatures and/or pressures may be selected such that the target silicon nitride level may be achieved. Further, while a CVD method of depositing silicon nitride is described, other methods may be employed. As just a few examples, silicon nitride may be deposited by high density plasma chemical vapor deposition (HDP CVD), or plasma assisted or enhanced CVD (PECVD/PACVD).

Figure 6D:
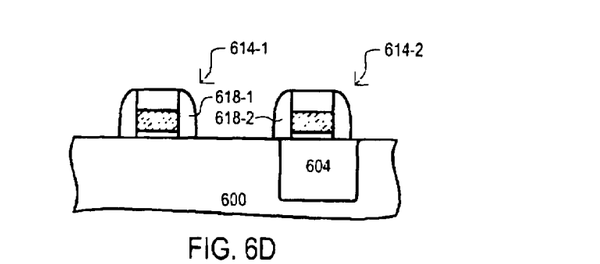
Figure 6E:
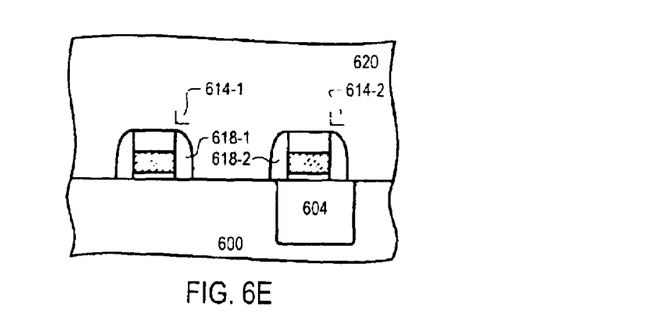

Following the deposition of a sidewall layer, sidewalls may be formed (step 508). Formation of sidewalls may include removing portion of a sidewall layer with an anisotropic etch. An integrated circuit following a step 508 is shown in FIG. 6D. Following a sidewall formation step, sidewalls 618-1 and 618-2 may be formed on gate structures 614-1 and 614-2, respectively A first insulating layer may then be deposited without first forming a liner (step 510). Thus, a third embodiment 500 may advantageously avoid a step in many conventional processes. Further, a more favorably thermal budget may result. An integrated circuit following a step 510 is shown in FIG. 6E. A first insulating layer 620 may be formed over a substrate 600 and gate structures (614-1 and 614-2). A first insulating layer 620 may include the same preferred formation methods and materials and/or be subject to the same variations discussed in conjunction with first insulating layer 208 in FIG. 2B.

As noted above, a first insulating layer 620 material may be selected to provide a different etch response than sidewalls and/or a top insulating layer when exposed to a contact etch. As one particular example, a first insulating layer 620 may include silicon oxide while sidewalls and/or a top insulating layer may include silicon oxynitride and/or silicon nitride. More particularly, a first insulating layer 620 may include HDP PSG, as described above, while sidewalls and/or a top insulating layer may include silicon nitride. HDP PSG may not require a reflow and/or densification step, and thus may provide a simpler manufacturing process and/or a process with an advantageously smaller thermal budget than a conventional approach that reflows or densifies such a layer.

In one particular approach to forming a first insulating layer of HDP PSG, a high density plasma may include low frequency power in a general range of 4000–4500 Watts and high frequency power in a general range of 1200–1500 Watts. PSG may be formed from a plasma comprising a mixture of a silicon source such as silane ($SiH_4$) or a chlorosilane $SiH_xCl_y$, where x+y=4 for example, an oxygen atom source such as ($O_2$), ozone ($O_3$) or nitrous oxide ($N_2O$) for example, and a phosphorous source such as phosphine ($PH_3$), $PH_aCl_b$, a methyl phosphine, $PH_a(CH_3)_b$, an ethyl phosphine $PH_a(C_2H_5)_b$ where a+b=3 for example. In one particular approach, silicon source flows into the plasma chamber may be in the general range of 5–100 standard $cm^3$ per minute (sccm), preferably 10–50 sccm, more preferably 23–30 sccm. Oxygen atom source flows may be in the general range of 20–1000 sccm, preferably 100–500 sccm, more preferably 350–400 sccm. Phosphorous source flows may be in the general range of 10–500 sccm, preferably 50–350 sccm, more preferably 170–200 sccm. Argon may also flow in the reaction chamber at a rate in the general range of 25–40 sccm.

The flow ratios of the silicon source and phosphorous source may be selected from the mathematical possibilities supported by the above ranges such that the target phosphorous level is achieved. However, preferred silicon source to phosphorous source flow rate ratios may be in the general range of 1:20 to 1:2, more preferably 1:10 to 1:5.

Of course, the various power levels and flow rates recited should not be construed as limiting the invention thereto. A relatively high, level of phosphorous and high density plasma may include the same general criteria described in conjunction with step 104 of FIG. 1. A level of phosphorous in an HDP PSG layer may be in the general range of 3–15% phosphorous (P) (by weight), preferably 4–12% P, more preferably 5–9% P.

A method of forming a HDP PSG layer in an integrated circuit is disclosed in commonly owned, co-pending U.S. patent application Ser. No. 09/300,817 entitled METHODS OF FILLING CONSTRAINED SPACES WITH INSULATING MATERIALS AND/OR OF FORMING CONTACT HOLES AND/OR CONTACTS IN AN INTEGRATED CIRCUIT, the contents of which are incorporated by reference herein.

Figure 6F:
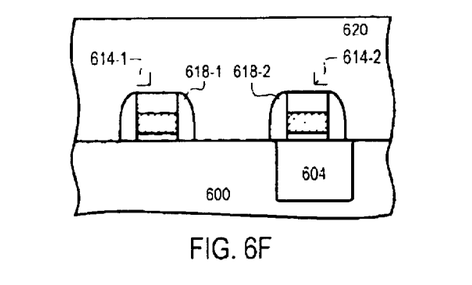

Once a first insulating layer has been deposited, it may be planarized (step 512). Planarization may be accomplished by a chemical-mechanical polishing (CMP) step, to name just one example. Alternatively, planarizing may be accomplished by an isotropic etching step, or by a relatively low temperature and/or short duration reflow step, but CMP is preferred. An integrated circuit following a step 512 is set forth in FIG. 6F. A first insulating layer 620 may include a substantially planar surface.

A third embodiment 500 may also include depositing a second insulating layer over the first insulating layer (step 514). A second insulating layer can form all or part of a "hard" etch mask for a first insulating layer. A second insulating layer may include silicon dioxide, preferably undoped silicon dioxide (undoped silicate glass or "USG"). A second insulating layer may be deposited using chemical vapor deposition (CVD), or plasma enhanced or plasma assisted CVD (PECVD and PACVD), or high density plasma (HDP) deposition, to name but a few examples. Preferably, tetraethylorthosilicate (TEOS) may be a source material in such a deposition step. In some arrangements, a second insulating layer may also be planarized.

Figure 6G:
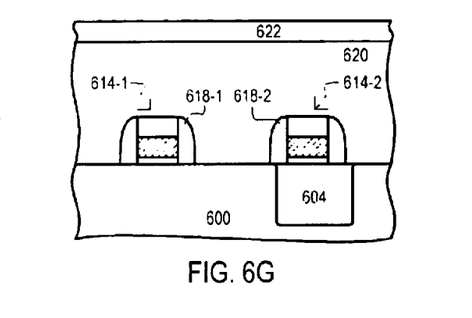

FIG. 6G shows a portion of a semiconductor device following the deposition of a second insulating layer 622. A second insulating layer 622 can be deposited over (but not necessarily on) a first insulating layer 620.

A third embodiment 500 may then form a contact etch mask (step 516). A step 516 may include conventional photolithographic techniques. A layer of photoresist may be patterned and developed over a second insulating layer and form a contact hole pattern in a photoresist material.

Figure 6H:
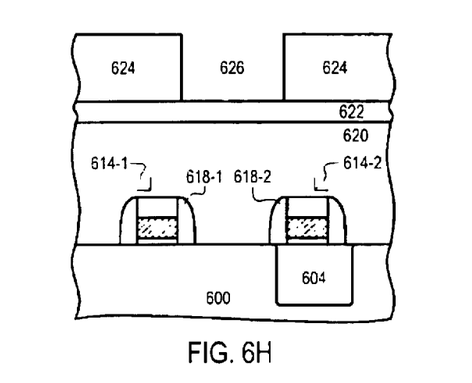

FIG. 6H shows an integrated circuit following the formation of a contact etch mask 624. A contact etch mask 624 may include mask openings 626. Mask openings 626 may be situated over locations where a contact hole may be formed.

A third embodiment 501 may further include a step that forms a hard etch mask that includes a second insulating layer (step 518). In one particular arrangement, a step 518 may include a RIE step having a high degree of selectivity between a second insulating layer and a contact etch mask. This can transfer a contact hole pattern in a contact etch mask, to a second insulating layer 622. A semiconductor device following such a step 518 is shown in FIG. 6I.

Figure 6I:
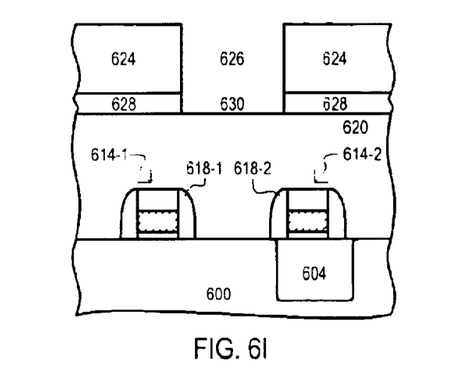

In FIG. 6I, portions of a second insulating layer have been removed according to a contact etch mask 624. Consequently, a hard etch mask 628 has been formed that includes a second insulating layer 622. In the particular arrangement of FIG. 6I, a hard etch mask can include a hard mask openings 630. A hard mask opening 630 may be situated over a location where a contact hole may be formed, preferably a self-aligned contact hole.

A third embodiment 500 may further include removing a contact etch mask (step 520). In the event a contact etch mask includes a photoresist, a step 520 may include "ashing" with a plasma etch, or the like. Of course, other conventional removal techniques can be utilized, according to the particular type of contact etch mask.

Figure 6J:
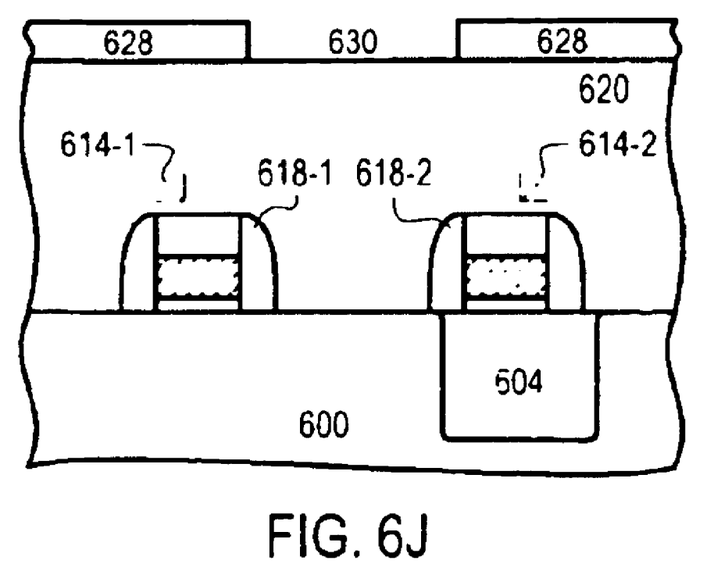

FIG. 6J illustrates an integrated circuit following the removal of a contact etch mask 624. A hard etch mask 628 remains over a first insulating layer 620. It is noted that removing a contact etch mask 624 can result in a hard self-aligned contact etch mask that produces a smaller aspect ratio for contact holes than other conventional approaches, such as those that may use photoresist as an etch mask.

A method of forming contact with a hard etch mask is disclosed in commonly owned co-pending U.S. patent application Ser. No. 09/326,432 entitled METHOD AND STRUCTURE FOR MAKING SELF-ALIGNED CONTACTS, the contents of which are incorporated by reference herein.

With a hard etch mask formed over a first insulating layer, a third embodiment 500 may continue with a self-aligned contact etch (step 522). A self-aligned contact (SAC) etch may form a contact hole through a first insulating layer to a substrate. A SAC etch may preferably be a reactive ion etch (RIE) that includes one or more chlori- and/or fluorinated carbon molecules as an activating gas. Such gases may include $CFCl_3$, $CF_2Cl_2$, $CF_3Cl$, $CF_4$, $CHF_3$, $C_2ClF_5$, and/or $C_2H_2F_4$, as just a few examples.

In a preferred approach, a SAC RIE may form a contact hole through a PSG layer. Such a RIE may preferably include trifluoromethane ($CHF_3$) and tetrafluoroethane ($C_2H_2F_4$). A flow rate for $C_2H_2F_4$ may be in the general range 1–20 sccm, preferably 3–15 sccm, more preferably 5–7 sccm. A flow rate for $CHF_3$ may be in the general range of 5–200 sccm, preferably 10–100, more preferably 30–50 sccm. A RIE may also include the introduction of an inert gas such as argon (Ar) and/or xenon (Xe), preferably Ar. A flow rate for Ar may be in the general range of 5–300 sccm, preferably 50–200, more preferably 110–140 sccm.

A preferred SAC RIE may also include radio frequency (RF) power values in the general range of 100–1000 Watts (W), preferably 200–700 W, more preferably 250–350 W. A bias to a surface on which a wafer may be situated, such as a RIE chamber cathode, may be in the general range of 100–1500 volts (V), preferably 500–1000 V, more preferably 650–750 V. Preferably, a bias voltage may be a negative voltage. A RIE chamber pressure may be in the general range of 10–200 mT, preferably 30–100 mT, more preferably 50–60 mT. A RIE chamber temperature may be in the general range of 0–35° C., preferably 5–30° C., more preferably 10–20° C. In one particular arrangement, integrated circuits are formed on wafer that may be situated on a "chuck" within a deposition chamber. A chuck may be cooled by the application of helium. A helium cooling, pressure may be in the general range of 1–50 Torr, preferably 5–20 Torr, more preferably about 50 Torr.

RIE etch times at the more preferred parameters referred to above may be in the general range of 80–200 seconds (s), preferably 100–200 s, more preferably 140–160 s.

Figure 6K:
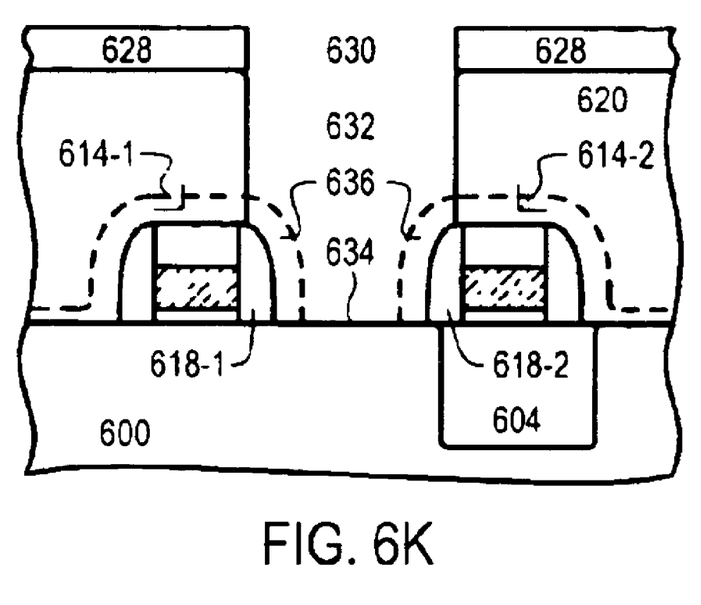

A preferred contact etch may have desirable selectivities between various structures in an integrated circuit. For example, an etch selectivity between a first insulating layer and a sidewall may be 10:1 or greater, preferably 0:1 or greater, more preferably 25:1 or greater. Such an etch selectivity can allow a sidewall (such as 618-1 and 618-2) to protect a gate portion of a gate structure (such as 614-1 to 614-2), essentially eliminating the need for a protective liner. Preferably, a first insulating layer includes HDP PSG and a sidewall includes silicon nitride.

In addition, or alternatively, an etch selectivity between a first insulating layer and a hard mask may be in the general range of 50:1 or greater, preferably 75:1 or greater, more preferably 100:1 or greater. Such an etch selectivity can allow a formation of a contact hole without removing substantial portions of a hard mask. Preferably a first insulating layer includes HDP PSG and a sidewall includes TEOS USG.

In addition, or alternatively, an etch selectivity between a first insulating layer and a substrate may be in the general range of 100:1 or greater, preferably 150:1 or greater, more preferably 200:1 or greater. Such an etch selectivity can allow a formation of a contact hole without the need for a liner to protect a substrate. Preferably, a first insulating layer includes HDP PSG and a substrate includes conventionally doped monocrystalline silicon.

In addition, or alternatively, an etch selectivity between a first insulating layer and a substrate isolation structure may be equal to or greater than the above-described selectivity between a first insulating layer and TEOS USG. Such an etch selectivity may essentially eliminate the need for a liner to protect all isolation structure. Preferably a first insulating layer includes HDP PSG and an isolation structure includes silicon dioxide.

An integrated circuit following a SAC etch is shown in FIG. 6K. A contact hole 632 may extend through a first insulating layer 620 and expose a portion of a substrate 600, and thereby form a contact area 634. A contact area 634 may be larger than an area formed in a conventional process that includes a liner, as remaining residual liners will not encroach into a contact area 634. To illustrate this aspect of a third embodiment 600, dashed lines 636 are included in FIG. 6K to illustrate the space residual liners could occupy.

In this way, a third embodiment 500 may provide larger contacts between adjacent conducting structures. It is noted that an adjacent gate arrangement such as that set forth in FIGS. 6A to 6K may be present in many integrated circuit arrangements. As just a few examples, parallel gate arrangements may occur in a random access memory (RAM) as word lines. However, non-parallel arrangements of gates may have larger contact areas and thus also benefit from the present invention.

A comparison of contact area width between a preferred embodiment and a conventional approach that includes a liner, may be understood with reference to a number of examples set forth in Tables 1 and 2.

TABLE 1

| Feature | Target Size (μm) (conventional) | Variation (μm) (conventional) | Target Size (μm) (embodiment) | Variation (μm) (embodiment) |
|---|---|---|---|---|
| Poly Pitch | 0.460 | NA | 0.460 | NA |
| Poly CD Final | 0.160 | 0.030 | 0.160 | 0.030 |
| 2 × Sidewall | 0.140 | 0.030 | 0.140 | 0.030 |
| 2 × Liner | 0.100 | 0.010 | 0.000 | 0.000 |
| Contact Bottom CD | 0.060 | 0.044 | 0.160 | 0.042 |
| Mask Opening Overlay | 0.069 | NA | 0.069 | NA |

TABLE 2

| Mask Opening CD (μm) | Contact Bottom CD (μm) (conventional) | Contact Bottom CD Worst (μm) (conventional) | Contact Bottom CD (μm) (embodiment) | Contact Bottom CD Worst (μm) (embodiment) |
|---|---|---|---|---|
| 0.20 | 0.06 | 0.014 | 0.1025 | 0.070 |
| 0.21 | 0.06 | 0.014 | 0.1075 | 0.075 |
| 0.22 | 0.06 | 0.014 | 0.1125 | 0.080 |
| 0.23 | 0.06 | 0.014 | 0.1175 | 0.085 |
| 0.24 | 0.06 | 0.014 | 0.1225 | 0.090 |
| 0.25 | 0.06 | 0.014 | 0.1230 | 0.090 |
| 0.26 | 0.06 | 0.014 | 0.1230 | 0.090 |
| 0.27 | 0.06 | 0.014 | 0.1230 | 0.090 |
| 0.28 | 0.06 | 0.014 | 0.1230 | 0.090 |
| 0.29 | 0.06 | 0.014 | 0.1230 | 0.090 |
| 0.30 | 0.06 | 0.014 | 0.1230 | 0.090 |

TABLE 2-continued

| Mask Opening CD (μm) | Contact Bottom CD (μm) (conventional) | Contact Bottom CD Worst (μm) (conventional) | Contact Bottom CD (μm) (embodiment) | Contact Bottom CD Worst (μm) (embodiment) |
|---|---|---|---|---|
| 0.31 | 0.06 | 0.014 | 0.1230 | 0.090 |
| 0.32 | 0.06 | 0.014 | 0.1230 | 0.090 |
| 0.33 | 0.06 | 0.014 | 0.1230 | 0.090 |

Table 1 sets forth various feature sizes. Different features in column 1 of Table 1 include a "poly pitch," that can represent the pitch of two parallel conducting structures (such as two polysilicon lines that may form transistor gates). A "poly CD final" can represent the width of a poly line. A "2× Sidewall" can represent the area between adjacent polysilicon lines that is occupied by opposing sidewalls. A "2× Liner" can represent the area between adjacent polysilicon lines that is occupied by opposing residual liner portions. A "contact bottom CD" can represent a resulting width of a contact bottom. A "mask opening overlay" can represent an alignment offset between a contact etch mask opening and the above-mentioned polysilicon lines.

Various feature values and corresponding variations in such values for a conventional example are set forth in columns 2 and 3 of Table 1. An example according to an embodiment is shown in columns 3 and 4. In the conventional case example, residual liner portions may consume 0.100 μm. However, in the example of an embodiment, there is no liner, therefore the "2× liner" value is zero.

Table 2 includes the resulting contact areas for various mask opening values. In column 1 of Table 2, mask opening values vary from 0.20 μm up to 0.33 μm, in increments of 0.01 μm. Columns 2 and 3 set forth a bottom CD value (representing a contact opening) including a worst case value, for a conventional case. Columns 4 and 5 set forth a bottom CD value and worst case value according to an embodiment.

As shown by columns 2 and 3 of Table 2, a bottom CD value remains at 0.06 μm, with a worst case of 0.014 μm. Due to the encroachment of a liner and the size of the space between adjacent polysilicon lines (which is 0.16 μm) variations in contact opening size do not result in any increase in a bottom CD value.

As shown by columns 4 and 5 of Table 2, contact bottom CD value in an embodiment can range from 0.1025 μm and reach a maximum of 0.123 μm. In this way, greater contact area can result by providing a contact forming method that does not include a liner.

A number of embodiments have been described setting forth approaches to forming a contact hole and/or forming a self-aligned contact hole. Such approaches may be implemented in existing fabrication systems to take advantage of the benefits of the various methods and structures described. As just one example, a manufacturer may change its current fabrication process to skip a liner forming step and subsequent liner removal step. Alternatively, or in addition, an insulating layer according to embodiments may be formed and a densifying and/or a reflow step may be skipped.

Further, by utilizing the advantageous thermal budget illustrated by the disclosed embodiments, a manufacturer may be capable of re-tooling a fabrication process to accommodate smaller geometry transistors, as the undesired diffusion of dopants from substrate diffusion regions may be more tightly controlled. In addition, or alternatively, lower resistance contacts may be formed. This may allow contact sizes to be decreased and/or improve integrated circuit operating speeds.

It is understood that while the various particular embodiments have been set forth herein, methods and structures according to the present invention could be subject to various changes, substitutions, and alterations without departing from the spirit and scope of the invention.

What is claimed is:

1. A method, comprising:

forming a contact hole through a first insulating layer that is self-aligned with respect to a transistor gate having a gate length less than 0.2 microns without forming a contact hole etch stop liner; and forming the contact hole includes reactive plasma etching through the first insulating layer comprising non-densified doped silicon dioxide.

2. The method of claim 1, wherein:

forming the contact hole includes reactive plasma etching through the first insulating layer comprising non-densified doped silicon dioxide.

3. The method of claim 1, wherein:

forming the contact hole includes reactive plasma etching through the first insulating layer comprising silicon dioxide having a concentration of phosphorous dopant that is greater than 5% by weight.

4. The method of claim 3, wherein:

the reactive plasma etching includes introducing $CHF_3$ and $C_2H_2F_4$ into an etch chamber.

5. The method of claim 4, wherein:

the flow rate of $CHF_3$ is less than ten times the flow rate of $C_2H_2F_4$.

6. The method of claim 5, wherein:

the flow rite of $CHF_3$ is in the general range of 3–15 standard centimeter cubed per minute (sccm); and the flow rate of $C_2H_2F_4$ is in the general range of 10–100 sccm.

7. The method of claim 3, wherein:

the reactive plasma etching includes exciting a plasma with a radio frequency power source that supplies power in the general range of 100 to 1000 Watts.

8. The method of claim 3, wherein:

the reactive plasma etching includes an etch time in the general range of 80 to 200 seconds.

9. The method of claim 3, wherein:

the contact hole is formed on a target object that is biased to an absolute value potential in the general range of 100 to 1500 Volts.

10. The method of claim 3, wherein:

the reactive plasma etching pressure is in the general range of 20–100 milliTorrs.

11. The method of claim 3, wherein:

the reactive plasma etching temperature is in the general range of 0–35° C.

* * * * *